US009850401B2

(12) United States Patent
Lai et al.

(10) Patent No.: US 9,850,401 B2
(45) Date of Patent: Dec. 26, 2017

(54) MULTILAYERED POLYIMIDE FILM HAVING A LOW DIELECTRIC CONSTANT, LAMINATE STRUCTURE INCLUDING THE SAME AND MANUFACTURE THEREOF

(71) Applicant: TAIMIDE TECHNOLOGY INCORPORATION, Xinpu Township (TW)

(72) Inventors: Chung-Ting Lai, Hsinchu Hsien (TW); Chih-Wei Lin, Hsinchu Hsien (TW)

(73) Assignee: Taimide Technology Incorporation, Hsinchu County (TW)

( * ) Notice: Subject to any disclaimer, the term of this patent is extended or adjusted under 35 U.S.C. 154(b) by 424 days.

(21) Appl. No.: 14/561,070

(22) Filed: Dec. 4, 2014

(65) Prior Publication Data
US 2015/0159043 A1 Jun. 11, 2015

(30) Foreign Application Priority Data
Dec. 5, 2013 (TW) ................................. 102144607

(51) Int. Cl.
| | | |
|---|---|---|
| *C09D 179/08* | (2006.01) | |
| *B32B 27/08* | (2006.01) | |
| *B32B 27/20* | (2006.01) | |
| *B32B 27/28* | (2006.01) | |
| *B32B 27/32* | (2006.01) | |
| *H05K 1/03* | (2006.01) | |
| *H05K 3/38* | (2006.01) | |
| *C08G 73/10* | (2006.01) | |
| *B32B 38/00* | (2006.01) | |
| *H05K 3/02* | (2006.01) | |

(52) U.S. Cl.
CPC ............ *C09D 179/08* (2013.01); *B32B 27/08* (2013.01); *B32B 27/20* (2013.01); *B32B 27/281* (2013.01); *B32B 27/322* (2013.01); *C08G 73/1039* (2013.01); *C08G 73/1042* (2013.01); *C08G 73/1053* (2013.01); *C08G 73/1071* (2013.01); *H05K 1/036* (2013.01); *H05K 3/381* (2013.01); *B32B 2038/0016* (2013.01); *B32B 2255/10* (2013.01); *B32B 2255/205* (2013.01); *B32B 2307/306* (2013.01); *B32B 2307/714* (2013.01); *B32B 2311/00* (2013.01); *B32B 2379/08* (2013.01); *B32B 2457/08* (2013.01); *H05K 3/022* (2013.01); *H05K 2201/015* (2013.01); *H05K 2201/0154* (2013.01); *H05K 2201/0212* (2013.01); *Y10T 428/2495* (2015.01); *Y10T 428/254* (2015.01); *Y10T 428/259* (2015.01); *Y10T 428/31544* (2015.04)

(58) Field of Classification Search
CPC ...................................................... C09D 179/08
USPC ....................................................... 428/213
See application file for complete search history.

(56) References Cited

U.S. PATENT DOCUMENTS

| | | | | |
|---|---|---|---|---|
| 2009/0297858 A1* | 12/2009 | Glenn | ...................... | B32B 27/08 428/421 |
| 2011/0033682 A1 | 2/2011 | Shimizu et al. | | |
| 2012/0043691 A1* | 2/2012 | Uekido | ................ | H05K 1/0346 264/173.16 |
| 2012/0095147 A1* | 4/2012 | Huang | ............... | C08G 73/1039 524/404 |
| 2013/0149515 A1* | 6/2013 | Jo | ......................... | H05K 1/0393 428/216 |

FOREIGN PATENT DOCUMENTS

| | | |
|---|---|---|
| CN | 1599538 | 3/2005 |
| CN | 1653115 | 8/2005 |
| CN | 101466544 | 6/2009 |
| CN | 101636432 | 1/2010 |
| CN | 102458848 | 5/2012 |
| CN | 102459466 | 5/2012 |
| JP | 433394 | 2/1992 |
| JP | 2005142572 | 6/2005 |
| JP | 2007119573 | 5/2007 |
| JP | 2007277493 | 10/2007 |
| JP | 2010518222 | 5/2010 |
| JP | 2012522863 | 9/2012 |
| JP | 2013018806 | 1/2013 |
| KR | 20020074489 | 9/2002 |
| KR | 20120003934 | 1/2012 |
| KR | 101299652 | 8/2013 |
| TW | I228727 | 3/2005 |
| TW | 201031708 | 9/2010 |
| TW | 201032680 | 9/2010 |
| TW | 201113327 | 4/2011 |
| WO | 2007123161 | 11/2007 |

(Continued)

OTHER PUBLICATIONS

Office Action from Korean Patent Application No. 10-2014-0173536 dated Apr. 22, 2016.
Office action of Taiwan Patent Application No. 102144607 dated Mar. 16, 2015.
Xi Kai, Xu Dan and Jia Xu-Dong, Polymer Materials Science and Engineering, vol. 20, No. 4, Jul. 2004—"Development of Low Dielectric Constant Polymer Materials" English abstract on p. 5.

(Continued)

*Primary Examiner* — Doris Lee
(74) *Attorney, Agent, or Firm* — Baker & McKenzie LLP

(57) ABSTRACT

A multilayered polyimide film includes a first polyimide layer containing fluorine-containing polymer particles and having a first surface and a second surface, and a second polyimide layer and a third polyimide layer respectively disposed on the first surface and the second surface. The second and the third polyimide layers contain organic silicon oxygen compound particles. The multilayered polyimide film has a coefficient of thermal expansion (CTE) between about 13 and about 30 ppm/° C.

13 Claims, 3 Drawing Sheets

(56) References Cited

FOREIGN PATENT DOCUMENTS

WO 2013036077 3/2013

OTHER PUBLICATIONS

Official Action from Japanese Patent Application No. 2014-245826 dated Nov. 17, 2015.
Official Action from Chinese Patent Application No. 201410733633.3 dated Apr. 25, 2016.

* cited by examiner

MULTILAYERED POLYIMIDE FILM HAVING A LOW DIELECTRIC CONSTANT, LAMINATE STRUCTURE INCLUDING THE SAME AND MANUFACTURE THEREOF

CROSS-REFERENCE TO RELATED APPLICATION

This application claims priority to Taiwan patent application No. 102144607 filed on Dec. 5, 2013.

BACKGROUND OF THE INVENTION

1. Field of the Invention

The present application relates to multilayered polyimide films, and more particularly to polyimide film having a low dielectric constant.

2. Description of the Related Art

Electronic products require increasingly thinner, smaller and lightweight print circuit boards (PCB). Moreover, because wireless internet and communication devices operate at higher frequency, efforts have been made to develop circuit boards capable of high transmission rates. Basic requirements for the materials of the circuit boards include the ability to transfer data at a high rate, and prevent data alteration or interference during transmission.

It is known that the transmission speed in semiconductor devices is mainly limited by the occurrence of delay between metal wires carrying the signals. In order to reduce the delay in signal transmission, an insulating layer having a low dielectric constant can be disposed between the wires, which can reduce capacitance coupling between the wires, enhance the operation speed and reduce noise interference. The insulating layer can block the flow of an electric current, and a lower dielectric constant can reduce the occurrence of undesirable stray capacitance. Moreover, the insulating material should have a dissipation factor that is as small as possible to minimize waste of electric energy. In other words, the high-frequency circuit boards need to have a low coefficient of thermal expansion (CTE), low dissipation factor ($D_f$), and stable and low dielectric constant ($D_k$).

To satisfy the aforementioned requirements, the material selected for making the board needs to exhibit a low dielectric constant, low thermal expansion, ability to form a multilayered structure, and good heat and chemical resistance. In this regard, polyimide has been widely used to make printed circuit boards. However, facing the tendency of size reduction of the products, there is still a need for a polyimide film having improved dielectric constant and capable of meeting the requisite CTE characteristics.

SUMMARY

The present application describes a multilayered polyimide film including a first polyimide layer incorporating fluorine-containing polymer particles and having a first surface and a second surface, and a second polyimide layer and a third polyimide layer respectively disposed on the first surface and the second surface, the second and the third polyimide layers respectively containing organic silicon oxygen compound particles. The multilayered polyimide film has a coefficient of thermal expansion (CTE) between 13 and 30 ppm/° C.

The present application also describes a laminate structure including a multilayered polyimide film as described previously, and two metal layers respectively contacting with the outer surfaces of the second and the third polyimide layers.

In another embodiment, the present application also provides a method of manufacturing a laminate. The method includes forming a first polyimide layer incorporating fluorine-containing polymer particles, the first polyimide layer having a first surface and a second surface opposite to each other; forming a second polyimide layer and a third polyimide layer respectively on the first surface and the second surface, wherein the second and the third polyimide layers respectively contain organic silicon oxygen compound particles, and the multilayered polyimide film composed by the first, the second and the third polyimide layers has a CTE value between 13 and 30 ppm/° C.; roughening outer surfaces of the second and the third polyimide layers to form rough surfaces; and forming a metal layer in contact with at least one of the rough surfaces.

DETAILED DESCRIPTION OF THE EMBODIMENTS

Figure 1:
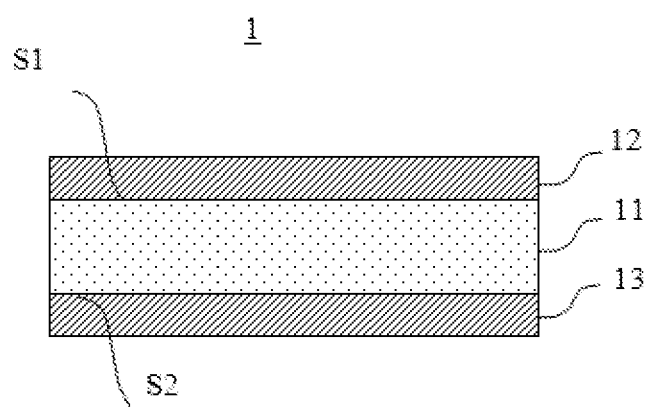
FIG. 1 is a schematic view illustrating an embodiment of a multilayered polyimide film.

FIG. 1 is a schematic view illustrating one embodiment of a multilayered polyimide film 1. The multilayered polyimide film 1 includes three polyimide layers 11, 12 and 13. The first polyimide layer 11 incorporate particles containing fluorine, and has a first surface S1 and a second surface S2 opposite to each other. The second polyimide layer 12 and the third polyimide layer 13 respectively incorporate particles containing organic silicon oxygen compounds, and are respectively disposed on the first surface S1 and the second surface S2.

In the multilayered polyimide film 1, the first polyimide layer 11 has desirably low dielectric constant $D_k$ and desirably low dissipation factor $D_f$, which can also be referred herein as a "low $D_k/D_f$ PI layer". In addition, a metal layer can be further formed on the outer surface of the second polyimide layer 12 and/or the third polyimide layer 13, each of the second and third polyimide layers 12 and 13 can also be referred herein as a "metalized polyimide layer".

In the multilayered polyimide film 1, each layer is made of a polyimide polymer formed by a condensation reaction of diamine and dianhydride monomers.

Examples of the diamine monomers can be 4,4'-oxydianiline (4,4'-ODA), phenylenediamine (p-PDA), 1,3-bis(4-aminophenoxy)benzene (TPER), 1,4-bis(4-aminophenoxy)benzene (TPEQ), 2,2'-dimethyl[1,1'-biphenyl]-4,4'-diamine (m-TB-HG), 1,3'-bis(3-aminophenoxy)benzene (APBN), 3,5-diaminobenzotrifluoride (DABTF), 2,2'-Bis(trifluoromethyl)benzidine (TFMB), 2,2'-bis[4-(4-aminophenoxyl)phenyl]propane (BAPP), 6-amino-2-(4-aminophenyl)benzoxazole (6PBOA), 5-amino-2-(4-aminophenyl)benzoxazole (5PBOA) and the like, which can be used alone or in combination.

Examples of the dianhydride monomers can be pyromellitic dianhydride (PMDA), 3,3',4,4'-biphenyltetracarboxylic dianhydride (BPDA), [4-(3,4dicarboxyphenoxy)phenyl]propane dianhydride (BPADA), 2,2'-bis-(3,4-Dicarboxyphenyl) hexafluoropropane dianhydride (6FDA), 4,4-Oxydiphthalic anhydride (ODPA), benzophenonetetracarboxylic dianhydride (BTDA), 3,3',4,4'-dicyclohexyltetracarboxylic acid dianhydride (HBPDA) and the like, which can be used alone or in combination.

The aforementioned diamine and dianhydride monomers can be divided into the following groups of monomer species:

i. Diamine:
Group (A): PDA, m-TB-HG, 6PBOA, 5PBOA and TFMB;
Group (B): ODA, TPER, TPEQ, APBN, DABTF and BAPP;

ii. Dianhydride:
Group (C): PMDA and BPDA; and
Group (D): BPADA, 6FDA, ODPA, HBPDA and BTDA.

A polyimide formed from the diamine and dianhydride monomers can be expressed by the general formula (A)a-(B)b-(C)c-(D)d, wherein "a" is the total number of moles of the monomers selected from Group (A), "b" is the total number of moles of the monomers selected from Group (B), "c" is the total number of moles of the monomers selected from Group (C), and "d" is the total number of moles of the monomers selected from Group (D). This general formula can express the selected monomers, but does not impose any limitation to the arrangement or the order of the monomers in the polyimide. Modifications and combinations of the monomers used in the general formula can be made. One or more species of monomers can be selected from each group, for example, diamine monomers selected from Group (A) can be PDA alone, or a combination of PDA and TFMB, or a combination of PDA, m-TB-HG and TFMB.

The parameters a, b, c and d can satisfy the following relations:

$$a+b+c+d=1,$$

$$a+b=0.5, \text{ and}$$

$$c+d=0.5.$$

In the multilayered polyimide film 1, the low $D_k/D_f$ PI layer (i.e., the first polyimide layer 11) also incorporates fluorine-containing polymer particles. The fluorine-containing polymer can be polytetrafluoroethylene (PTFE), perfluoroalkoxy (PFA), fluorinated ethylene propylene (FEP), chlorotrifluoroethylene (CTFE), ethylene chlorotrifluoroethylene (ECTFE), polyfluorinated vinylidene (PVDF) and the like, which can be used alone or in combination.

The fluorine-containing polymer particles can be about 10 wt % to about 45 wt % of the first polyimide layer 11, e.g., 10 wt %, 15 wt %, 20 wt %, 25 wt %, 30 wt %, 35 wt %, 40 wt %, 45 wt %, or any intermediate values between above these values. The fluorine-containing polymer particles have an average particle diameter ranging from about 1 μm to about 5 μm, e.g., 1 μm, 1.5 μm, 2 μm, 3 μm, 4 μm, 4.5 μm, 5 μm, or any intermediate values between above these values.

The first polyimide layer 11 can be formed from a condensation reaction applied to different associations of the diamine and dianhydride monomers as described hereinafter. According to a first embodiment, the first polyimide layer 11 can incorporate fluorine-containing polymer particles in an amount between about 10 wt % and about 30 wt %, and can be formed from a condensation reaction applied on diamine monomers selected from one or more of PDA, m-TB-HG and TFMB in Group (A), and dianhydride monomers selected from both of Groups (C) and (D). In addition, the parameters a, b, c and d meet the following conditions:

$$a+b+c+d=1 \ (b=0 \text{ in this embodiment}),$$

$$0.05 \leq d \leq 0.15, \text{ and}$$

$$c \neq 0.$$

One or more monomer species can be selected from each of the aforementioned groups to form the first polyimide layer 11 in the first embodiment. In one example, d can be 0.14, 0.12, 0.1, 0.07, 0.05, 0.03, 0.02, 0.01, or any intermediate values between above these values.

An example of the first polyimide layer 11 according to the aforementioned first embodiment can incorporate PTFE as fluorine-containing polymer particles in an amount of 30 wt %, and can be formed by reacting about 0.5 moles of TFMB as diamine monomers, and either a combination of about 0.45 moles of BPDA and about 0.05 moles of BPADA, or a combination of about 0.45 moles of BPDA and about 0.05 moles of 6FDA as dianhydride monomers. The polyimide polymer thereby formed can be represented by the expression $TFMB_{0.5}\text{-}BPDA_{0.45}\text{-}BPADA_{0.05}$ or $TFMB_{0.5}\text{-}BPDA_{0.45}\text{-}6FDA_{0.05}$.

According to a second embodiment, the first polyimide layer 11 can incorporate PTFE as the fluorine-containing polymer particles in an amount between about 20 and about 30 wt %, and can be formed from a condensation reaction applied on diamine monomers selected from both of Groups (A) and (B), dianhydride monomers selected from both of Groups (C) and (D). In addition, the parameters a, b, c and d meet the following conditions:

$$a+b+c+d=1, \text{ and}$$

$$0.1 \leq b+d \leq 0.3.$$

One or more monomer species can be selected from each of the aforementioned groups (A), (B), (C) and (D) to form the first polyimide layer 11 in the second embodiment.

According to a third embodiment, the first polyimide layer 11 can incorporate PTFE as fluorine-containing polymer particles in an amount between about 20 and about 30 wt %, and can be formed from a condensation reaction applied on diamine monomers selected from Group (B), and dianhydride monomers selected from both of Groups (C) and (D). In addition, the parameters a, b, c and d meet the following conditions:

$$a+b+c+d=1 \ (a=0 \text{ in this embodiment}), \text{ and}$$

$$0.1 \leq b+d \leq 0.3.$$

One or more monomer species can be selected from each of the aforementioned groups (B), (C) and (D) to form the first polyimide layer 11 in the third embodiment.

According to a fourth embodiment, the first polyimide layer 11 can incorporate fluorine-containing polymer particles in an amount between about 30 and about 45 wt %, and can be formed from a condensation reaction applied on diamine monomers selected from Group (A), and dianhydride monomers selected from both of Groups (C) and (D). In addition, the parameters a, b, c and d meet the following conditions:

$$a+b+c+d=1 \ (b=0 \text{ in this embodiment}), \text{ and}$$

$$0 \leq d \leq 0.075.$$

One or more monomers can be selected from each of the aforementioned groups (A), (C) and (D) to form the first polyimide layer 11 in the fourth embodiment.

An example of the first polyimide layer 11 according to the fourth embodiment can incorporate PTFE as fluorine-containing polymer particles in an amount of 45 wt %, and can be formed by reacting about 0.5 moles of TFMB as diamine monomers, and either a combination of about 0.425 moles of BPDA and about 0.075 moles of BPADA, or a combination of about 0.425 moles of BPDA and about 0.075 moles of 6FDA as dianhydride monomers. The polyimide polymer thereby formed can be respectively represented by the expression $TFMB_{0.5}\text{-}BPDA_{0.425}\text{-}BPADA_{0.075}$ or $TFMB_{0.5}\text{-}BPDA_{0.425}\text{-}6FDA_{0.075}$.

According to a fifth embodiment, the first polyimide layer 11 can incorporate fluorine-containing polymer particles in an amount between 30 and 45 wt %, and can be formed from a condensation reaction applied on diamine monomers selected from both of Groups (A) and (B), and dianhydride monomers selected from both of Groups (C) and (D). In addition, the parameters a, b, c and d meet the following conditions:

$a+b+c+d=1$, and $b+d<0.15$.

One or more monomer species can be selected from each of the groups (A), (B), (C) and (D) to form the first polyimide layer 11 according to the fifth embodiment.

According to a sixth embodiment, the first polyimide layer 11 can incorporate fluorine-containing polymer particles in an amount between 30 and 45 wt %, and can be formed from a condensation reaction applied on diamine monomers selected from Group (B), and dianhydride monomers selected from both of Groups (C) and (D). In addition, the parameters a, b, c and d meet the following conditions:

$a+b+c+d=1$ ($a=0$ in this embodiment), and $b+d<0.15$.

One or more monomer species can be selected from each of the groups (B), (C) and (D) to form the first polyimide layer 11 in the sixth embodiment.

The first polyimide layer 11 formed as described herein can have a coefficient of thermal expansion (CTE) between about 13 ppm/° C. and about 30 ppm/° C., for example, 15 ppm/° C., 18 ppm/° C., 20 ppm/° C., 22 ppm/° C., 25 ppm/° C., 28 ppm/° C., 29 ppm/° C., 30 ppm/° C., or any intermediate values between above these values.

With respect to the metalized polyimide layers (i.e., the second and the third polyimide layers 12 and 13), the formed polyimide can be likewise represented by the general formula (A)a-(B)b-(C)c-(D)d, wherein "a" is the total number of moles of the monomers selected from Group (A), "b" is the total number of moles of the monomers selected from Group (B), "c" is the total number of moles of the monomers selected from Group (C), and "d" is the total number of moles of the monomers selected from Group (D). One or more species of monomers can be selected from each group, for example, diamine monomers selected from Group (A) can be PDA alone, or a combination of PDA and TFMB, or a combination of PDA, m-TB-HG and TFMB.

Like previously described, the parameters a, b, c and d satisfy the following relations:

$a+b+c+d=1$, $a+b=0.5$, and $c+d=0.5$.

Any of the second and third polyimide layers 12 and 13 can be formed by condensation reaction applied to different associations of the diamine and dianhydride monomers as described hereinafter. According to a seventh embodiment, the diamine monomers can be selected from Group (A) as m-TB-HG, TFMB or a combination thereof, and the dianhydride monomers can be selected from Group (C) as PMDA, BPDA or a combination thereof According to an eighth embodiment, any of the second and third polyimide layer 12 and 13 can be formed by reacting diamine monomers selected from m-TB-HG, TFMB or a combination thereof in Group (A), and dianhydride monomers selected from at least one monomer species in Group (C) and at least one monomer species in Group (D). In addition, the dianhydride monomers selected from the group (D) has a total number of moles equal to or less than 0.45, based on the total number of moles of diamine and dianhydride monomers. For example, d can be 0.45, 0.44, 0.42, 0.4, 0.35, 0.3, 0.2, 0.1, 0.05, 0.01, or any intermediate values between above these values.

According to a ninth embodiment, any of the second and third polyimide layer 12 and 13 can be formed by reacting PDA alone as diamine monomers, and dianhydride monomers selected from one or more monomer species of Groups (C) and (D) except PMDA. In other words, the dianhydride monomers are selected among BPDA, BPADA, 6FDA, ODPA, HPBDA, and BTDA.

According to a tenth embodiment, any of the second and third polyimide layer 12 and 13 can be formed by reacting diamine monomers selected from one or more monomer species of Group (B), and dianhydride monomers selected from both of Groups (C) and (D). In addition, the parameters a, b, c and d meet the following conditions:

$a+b+c+d=1$ ($a=0$ in this embodiment), $b+d<0.9$, $c\neq0$, and $d\neq0$.

One or more monomer species can be selected from each of the aforementioned groups. The sum b+d can be, for example, 0.85, 0.8, 0.7, 0.6, 0.5, 0.4, 0.3, 0.2, 0.1, or any intermediate values between above these values.

According to an eleventh embodiment, any of the second and third polyimide layer 12 and 13 can be formed by reacting diamine monomers selected from one or more monomer species in both of Groups (A) and (B), and dianhydride monomers selected from one or more monomer species in both of Groups (C) and (D). In addition, the parameters a, b, c and d meet the following conditions:

$a+b+c+d=1$, $b+d<0.9$, $a\neq0$, and $b\neq0$.

The sum b+d can be equal to, for example, 0.85, 0.8, 0.7, 0.6, 0.5, 0.4, 0.3, 0.2, 0.1, or any intermediate values between above these values.

Particles made of an organic silicon oxygen compound can also be incorporated in the second and the third polyimide layers 12 and 13 of the multilayered polyimide film 1. The organic silicon oxygen compound is an additive that can promote adhesion between the polyimide layer and the metal layer. Examples of the organic silicon oxygen compound can include, without limitation, organic silicon dioxide, silicone (e.g., dimethylsiloxane) and the like.

The organic silicon oxygen compound particles have a particle size in the order of nanometers. The average particle diameter is between about 1 nm and about 100 nm, e.g., 1 nm, 3 nm, 5 nm, 10 nm, 30 nm, 50 nm, 100 nm, or any intermediate values between above these values.

The second polyimide layer 12 formed as described herein can have a CTE between about 5 ppm/° C. and about 60 ppm/° C., such as 5, 10, 15, 20, 30, 40, 50, 55, 60 ppm/° C., or any intermediate values between above these values.

In the multilayered polyimide film 1, the first polyimide layer 11 has a thickness h1, the second polyimide layer has a thickness h2, and the ratio h2/h1 is about 1/6 or less, for example, 1/6, 1/7, 1/8, 1/10, 1/12, 1/15, or any intermediate values between above these values.

In one embodiment, the multilayered polyimide film 1 has a total thickness equal to about 80 μm or less, such as 80 μm, 75 μm, 70 μm, 60 μm, 50 μm, 30 μm, 20 μm, 15 μm, 10 μm, or any intermediate values between above these values.

The multilayered polyimide film 1 has a dielectric constant $D_k$ lower than 3.2, such as 3.1, 3.0, 2.8, 2.5, 2.0, 1.5, 1.2, or any intermediate values between above these values. The multilayered polyimide film 1 has a dissipation factor $D_f$ lower than 0.012, such as 0.010, 0.008, 0.005, 0.002, 0.001, or any intermediate values between above these values.

Figure 2A:
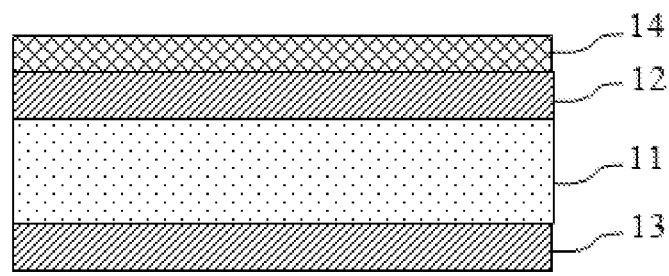
FIGS. 2A and 2B are schematic views illustrating an embodiment of a laminate using the multilayered polyimide film.
Figure 2B:
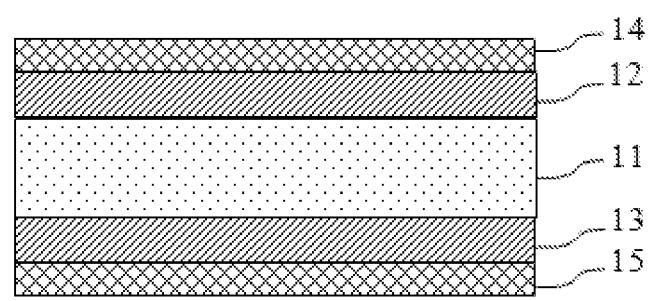

FIG. 2A is a schematic view illustrating an embodiment of a laminate 2 including the multilayered polyimide film 1 and a metal layer 14, the metal layer 14 being in contact with the outer surface of the second polyimide layer 12. FIG. 2B is a schematic view illustrating another embodiment of the laminate 2 containing two metal layers 14 and 15 respectively in contact with the outer surfaces of the second and the third polyimide layers 12 and 13.

Figure 3:
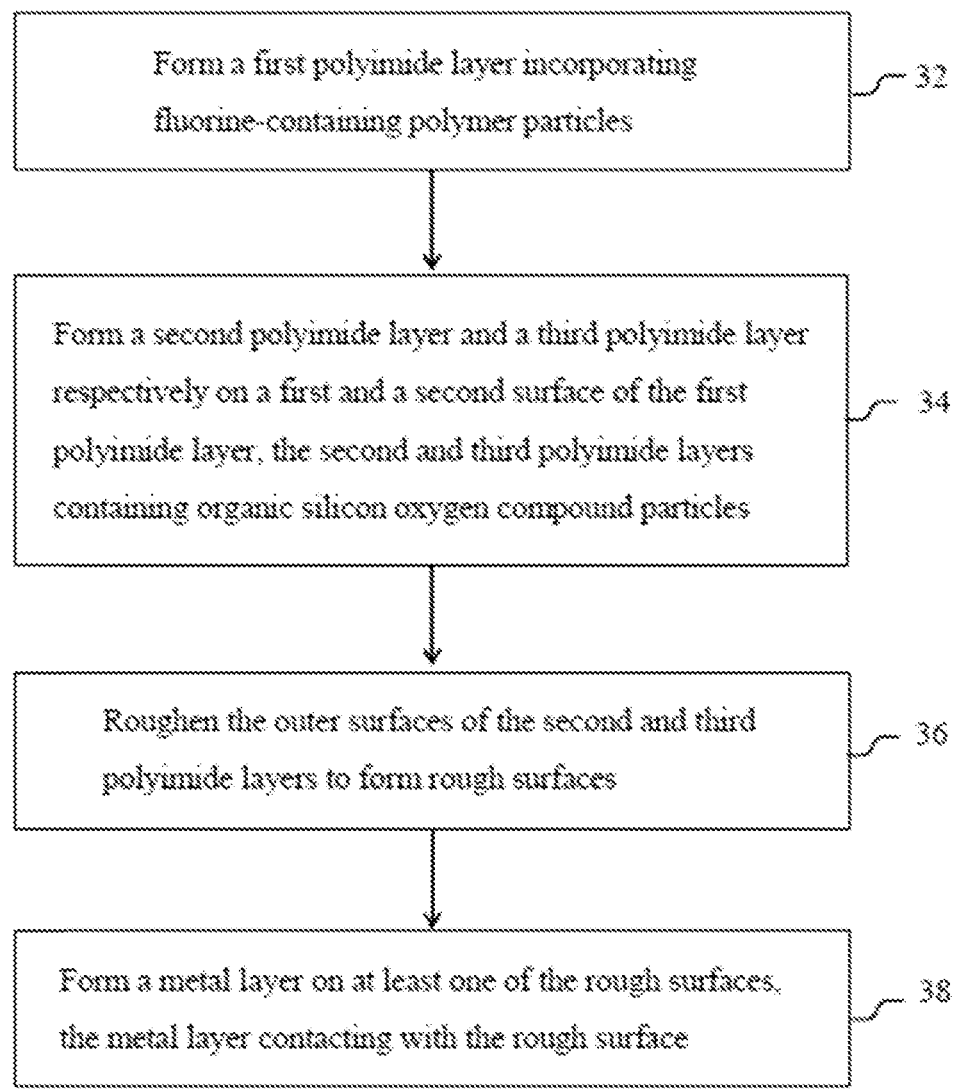
FIG. 3 is a flowchart illustrating method steps of manufacturing a laminate including the multilayered polyimide film.

FIG. 3 is a flowchart illustrating a method of fabricating a laminate. The method includes forming a first polyimide layer 11 incorporating fluorine-containing polymer particles, the first polyimide layer 11 having a first surface S1 and a second surface S2 opposite to each other (step 32). In step 34, a second polyimide layer 12 and a third polyimide layer 13 are respectively formed on the first surface S1 and the second surface S2. The second and the third polyimide layers 12 and 13 respectively contain organic silicon oxygen compound particles, and the entire multilayered polyimide film composed by the first, second and third polyimide layers 11, 12 and 13 has a CTE between about 13 ppm/° C. and about 30 ppm/° C. In step 36, the outer surface of the second polyimide layer 12 is then roughened to form a coarse surface. The roughening step can remove organic silicon oxygen compound particles on the surface of the second polyimide layer 12, so that nanometer-scale microstructures can be formed thereon.

In step 38, a metal layer 14 is eventually deposited in contact with the coarse surface. The metal layer 14 can be formed by any known methods, such as, electroless plating, electroplating, a combination of electroless plating and electroplating, physical vapor deposition, chemical vapor deposition and the like. In one embodiment, electroplating can be applied to precipitate the metal catalyst on the surface of the second polyimide layer (including the surface of the nanometer-scale microstructures), then electroless plating can be applied to precipitate the target metal such as copper to form the metal layer. With a combined electroless plating and electroplating, the first metal is barely precipitated by electroless plating, and then a thicker layer of a second metal is formed thereon by electroplating, wherein the first and the second metals can be identical or different.

Examples of the metal layer can include, without limitation, copper, nickel, gold, silver, platinum, tin, lead, cobalt, manganese, molybdenum, palladium, or any alloy or combination thereof. In some embodiments, the metal layer can be copper, nickel or lead formed by electroless plating. In some other embodiments, the metal layer can be a copper layer formed by electroplating.

The thickness of the metal layer can be set according to the design requirements. In one embodiment, the thickness of the metal layer can be about 1 μm to about 50 μm, preferably about 2 μm to about 40 μm.

Examples for fabricating the polyimide film are described hereinafter.

EXAMPLES

Example 1

Preparation of a First Polyimide Layer (i.e., Low $D_k/D_f$ Polyimide Layer)

About 67.91 g of TFMB and about 412.5 g of dimethylacetamide (DMAC) can be added into a three-necked flask and agitated under 30° C. until complete dissolution. Then about 53.04 g of BPDA and about 13.55 g of BPADA can be added into the solution, which is continuously agitated and reacted at a temperature of 25° C. for about 20 hours to form a first polyamic acid (PAA) solution having a viscosity of 140,000 cps (centipoise). In this example, the quantity of the reacted monomers is 25 wt % of the reaction solution.

About 30 wt % of PTFE powder (i.e., PTFE powder is about 30 wt % based on the total weight of the monomers) can be added into the first PAA solution and agitated. Acetic anhydride and picoline can be added as catalyst into the first PAA solution. The PAA:acetic anhydride:picoline molar ratio is about 1:2:1. After it is agitated homogeneously, the reaction solution can be coated onto a glass plate, baked at 80° C. for 30 minutes, and then 170-350° C. for 4 hours. A low $D_k/D_f$ polyimide film can be thereby formed having a thickness of 12 μm.

Preparation of a Second Polyimide Layer (i.e., Metalized Polyimide Layer)

About 71.66 g of TFMB and about 412.5 g of DMAC can be added into a three-necked flask and agitated at a temperature of 30° C. until complete dissolution. Then about 65.18 g of BPDA can be added into the solution, which is continuously agitated and reacted at a temperature of 25° C. for 48 hours to form a second PAA solution having a viscosity of 140,000 cps. In this example, the quantity of the reacted monomers is 25 wt % of the reaction solution. About 367 g of DMAC can be added into the second PAA solution for dilution. Based on the total weight of the formed polyimide film, about 0.1-10 wt % of the organic silicon oxygen compound powder can be added to enhance metal adhesion. After it is agitated homogeneously, the reaction solution can be coated onto a glass plate, and baked under the same conditions of the first polyimide layer. The formed film has a thickness equal to 2 μm.

Preparation of a Tri-layered Polyimide Film

The first polyimide layer prepared as described previously can be fixed on a glass plate. The second PAA solution can be coated onto the first polyimide layer, and then baked under the same conditions of the first polyimide layer to form the second layer. Then a third layer can be formed on the other surface of the first polyimide layer opposite to the side of the second layer by applying the second PAA solution through the same steps. A tri-layered polyimide film can be thereby formed having a total thickness equal to 16 μm.

Example 2

A tri-layered film is prepared like in Example 1, except that the reacted monomers of the first polyimide layer are about 65.62 g of TFMB, about 45.22 g of BPDA, and about 26.66 g of BPADA, and the reacted monomers of the second polyimide layer are about 65.62 g of TFMB, about 45.22 g of BPDA, and about 26.66 g of BPADA. In this example, the quantity of the reacted monomers is about 25 wt % of the reaction solution.

Example 3

A tri-layered film is prepared like in Example 1, except that the reacted monomers of the first polyimide layer are about 65.54 g of TFMB, about 41.50 g of BPDA, and about 31.46 g of BPADA, and the reacted monomers of the second polyimide layer are about 54.58 g of TFMB, about 7.52 g of BPDA, and about 75.39 g of BPADA. In this example, the quantity of the reacted monomers is about 25 wt % of the reaction solution.

Example 4

A tri-layered film is prepared like in Example 3, except that the first polyimide layer has a thickness equal to 60 μm, the second polyimide layer has a thickness equal to 10 μm and the total thickness of tri-layered film is 80 μm.

Example 5

A tri-layered film is prepared like in Example 3, except that the first polyimide layer has a thickness equal to 5 μm, the second polyimide layer has a thickness equal to 0.1 μm, and the total thickness of tri-layered film is 5.2 μm.

Example 6

A tri-layered film is prepared like in Example 3, except that the first polyimide layer contains 20 wt % of PTFE.

Example 7

A tri-layered film is prepared like in Example 3, except that the first polyimide layer contains 45 wt % of PTFE.

Example 8

A tri-layered film is prepared like in Example 1, except that the reacted monomers of the second polyimide layer are about 37.15 g of ODA, about 12.14 g of PDA, and about 88.21 g of PMDA. In this example, the quantity of the reacted monomers is about 25 wt % of the reaction solution.

Example 9

A tri-layered film is prepared like in Example 3, except that the first polyimide layer contains 10 wt % of PTFE.

Comparative Example 1

A tri-layered film is prepared like in Example 1, except that the reacted monomers of the second polyimide layer are about 45.55 g of PDA and about 91.95 g of PMDA. In this example, the quantity of the reacted monomers is about 25 wt % of the reaction solution.

Comparative Example 2

A tri-layered film is prepared like in Example 1, except that the reacted monomers of the first polyimide layer are 69.12 g of TFMB, 57.15 g of BPDA, and 11.23 g of BPADA. In this example, the quantity of the reacted monomers is about 25 wt % of the reaction solution.

Comparative Example 3

A tri-layered film is prepared like in Example 1, except that the first polyimide layer has a thickness equal to 10 μm, and the total thickness of tri-layered film is 14 μm.

Comparative Example 4

A tri-layered film is prepared like in Example 1, except that the first polyimide layer has a thickness equal to 66 μm, the second polyimide layer has a thickness equal to 11 μm, and the total thickness of the tri-layered film is 88 μm.

Comparative Example 5

A tri-layered film is prepared like in Example 3, except that the reacted monomers of the second polyimide layer are 53.83 g of TFMB, 4.95 g of BPDA, and 78.73 g of BPADA. In this example, the quantity of the reacted monomers is about 25 wt % of the reaction solution.

Comparative Example 6

A tri-layered film is prepared like in Example 3, except that the reacted monomers of the first polyimide layer are 63.48 g of TFMB and 37.91 g of BPDA. In this example, the quantity of the reacted monomers is about 25 wt % of the reaction solution.

Comparative Example 7

A tri-layered film is prepared like in Example 1, except that the first polyimide layer has a thickness equal to 10 μm, and the total thickness of tri-layered film is 14 μm.

Comparative Example 8

A tri-layered film is prepared like in Example 3, except that the first polyimide layer has a thickness equal to 66 μm, the second polyimide layer has a thickness equal to 11 μm, and the total thickness of the tri-layered film is 88 μm.

Comparative Example 9

A tri-layered film is prepared like in Example 3, except that the first polyimide layer contains 5 wt % of PTFE, and the reacted monomers of the second polyimide layer are 3.63 g of PDA, 60.54 g of ODA, and 73.33 g of PMDA. In this example, the quantity of the reacted monomers is about 25 wt % of the reaction solution.

Comparative Example 10

It is attempted to prepare a tri-layered film like in Example 3, except that the first polyimide layer contains 50 wt % of PTFE. No film can be eventually formed in this comparative example.

Comparative Example 11

A tri-layered film is prepared like in Example 1, except that the second polyimide layer does not contain any additive to enhance metal adhesion.

Preparation of a Metal Laminate

Step 1. Roughening Process of the Film Surface

The tri-layered polyimides film prepared according to the above example or comparative examples can be immersed in 10 g/L of a NaOH solution at a temperature of 80° C. for 10 minutes to remove the organic silicon oxygen compound particles that are near the surface or exposed to the outer environment. Accordingly, nanometer-scale microstructures can be formed on the surface of the tri-layered polyimide film (i.e., the outer surface of the second polyimide layer).

Step 2. Deposition of Palladium Catalyst and Deposition of Nickel-palladium Metal Layer After the roughening process, the tri-layered polyimide film can be immersed in a catalyst solution containing $PbCl_2$ and $SnCl_2$ for 30 minutes to deposit a palladium catalyst on the film surface and in the microstructures. The tri-layered polyimide film then can be immersed in a reagent containing $NiSO_4$, $NiCl_2$ and boric acid for 30 minutes to deposit metallic nickel-palladium.

Step 3. Copper Plating

After deposition of the nickel-palladium layer, the polyimide film can be immersed in a copper-containing plating solution. Thin copper layers having a thickness of 0.3-0.5 μm can be formed on the two surfaces of the polyimide film via electroless copper plating (or deposition, physical/chemical vapor deposition). Then the copper layer having a thickness of 30 μm can be formed via electroplating.

Test Example

The polyimide films prepared according to the aforementioned Examples and Comparative Examples are tested to measure the following proprieties.

Measure of the Coefficient of Thermal Expansion (CTE)

A size variation of a film subjected to a thermal stress between 50° C. and 500° C. is measured by using a thermal mechanical analyzer TMAQ400 (sold by TA Instruments, Inc.). The test sample of the film has a length of 15 mm and a width of 4 mm. The temperature variation is conducted twice under nitrogen atmosphere with a ramping rate of about 20° C./min. A size variation in the second stage of temperature rise is recorded to avoid the effect of residual stress. The following equation is applied to derive the average CTE:

$$CTE(ppm/° C.) = (L-L_0)/\{L_0 \times (T-T_0)\} \times 10^6$$

In the aforementioned equation, $L_0$ is the length of the polyimide film at 50° C.; L is the length of the polyimide film at the test temperature (T); $T_0$ is 50° C.; and T is the test temperature 350° C.

Measure of the Dielectric Constant $D_k$ and Dissipation Factor $D_f$

The sample is immersed in deionized water for 10 minutes, and then is baked in an oven at about 110° C. for 30 minutes to dry. The value $D_k/D_f(0\ hr)$ is measured by using a resistance meter Agilent 4294A. Then the sample is placed at ambient temperature for 72 hours, and the value $D_k/D_f(72\ hr)$ is measured.

Evaluation of the Adhesion of the Metal Layer

To evaluate the adhesion between the metal layer and the second or the third polyimide layer of the tri-layered polyimide film, a cross-cut cellophane tape peel test based on JIS K-5400 can be applied to the prepared PI film-metal laminate. Determination shown as follows is based on the residual grids of 100 grids after peeling:

Good (it is able to adhere to the metal): 100-90 residual grids of 100 grids,
Poor (it is unable to adhere to the metal): 89-0 residual grids of 100 grids.

The results are shown in Table 1.

TABLE 1

|  | $2^{nd}$ polyimide layer | $1^{st}$ polyimide layer | | Thickness ratio ($2^{nd}$ polyimide layer/$1^{st}$ polyimide layer) | Total thickness of tri-layered polyimide film (μm) | Tri-layered polyimide film | | | Adhesion with the metal layer |
|---|---|---|---|---|---|---|---|---|---|
|  | CTE (ppm/° C.) | PTFE content (wt %) | CTE (ppm/° C.) |  |  | CTE (ppm/° C.) | $D_k$ | $D_f$ |  |
| Example 1 | 6 | 30 | 15 | 1/6 | 16 | 13 | 2.74 | 0.0086 | Good |
| Example 2 | 16 | 30 | 22 | 1/6 | 16 | 20 | 2.90 | 0.0068 | Good |
| Example 3 | 56 | 30 | 27 | 1/6 | 16 | 28 | 2.76 | 0.0074 | Good |
| Example 4 | 56 | 30 | 27 | 1/6 | 80 | 29 | 2.71 | 0.0079 | Good |
| Example 5 | 56 | 30 | 27 | 1/50 | 5.2 | 26 | 2.89 | 0.0071 | Good |
| Example 6 | 56 | 20 | 21 | 1/6 | 16 | 22 | 2.94 | 0.0062 | Good |
| Example 7 | 56 | 45 | 26 | 1/6 | 16 | 27 | 2.38 | 0.0055 | Good |
| Example 8 | 7 | 30 | 15 | 1/6 | 16 | 13 | 3.14 | 0.0110 | Good |
| Example 9 | 56 | 10 | 18 | 1/6 | 16 | 16 | 3.04 | 0.0069 | Good |
| Comparative Example 1 | 4 | 30 | 15 | 1/6 | 16 | 12 | 2.98 | 0.0092 | Good |
| Comparative Example 2 | 6 | 30 | 12 | 1/6 | 16 | 10 | 2.81 | 0.0074 | Good |
| Comparative Example 3 | 6 | 30 | 15 | 1/5 | 14 | 12 | 3.02 | 0.0081 | Good |
| Comparative Example 4 | 6 | 30 | 15 | 1/6 | 88 | 12 | 3.02 | 0.0081 | Good |
| Comparative Example 5 | 63 | 30 | 27 | 1/6 | 16 | 32 | 2.87 | 0.0068 | Good |

TABLE 1-continued

|  | 2nd polyimide layer | 1st polyimide layer | | Thickness ratio (2nd polyimide layer/1st polyimide layer) | Total thickness of tri-layered polyimide film (μm) | Tri-layered polyimide film | | | |
|---|---|---|---|---|---|---|---|---|---|
|  | CTE (ppm/° C.) | PTFE content (wt %) | CTE (ppm/° C.) |  |  | CTE (ppm/° C.) | Dk | Df | Adhesion with the metal layer |
| Comparative Example 6 | 56 | 30 | 32 | 1/6 | 16 | 34 | 2.94 | 0.0067 | Good |
| Comparative Example 7 | 56 | 30 | 27 | 1/5 | 14 | 31 | 2.91 | 0.0064 | Good |
| Comparative Example 8 | 56 | 30 | 27 | 1/6 | 88 | 33 | 2.98 | 0.0061 | Good |
| Comparative Example 9 | 10 | 5 | 14 | 1/6 | 16 | 13 | 3.34 | 0.0012 | Good |
| Comparative Example 10 | 56 | 50 | | | No film can be formed. | | | | |
| Comparative Example 11 | 6 | 30 | 15 | 1/6 | 16 | 13 | 2.74 | 0.0086 | Poor |

As shown in Table 1, in the tri-layered polyimide film of Examples 1-9, the first polyimide layer has a CTE between 15 and 30 ppm/° C., and the second polyimide layer has a CTE between 5 and 60 ppm/° C., which meet the desired CTE range of the film. These tri-layered polyimide films have relatively low $D_k$ and $D_f$ values, good adhesion with metal, and a CTE of the entire film between 13 and 30 ppm/° C. that matches with that of a copper foil. Accordingly, film defects induced by warp and rupture can be prevented.

Compared to Examples 1 and 3, the test results of Comparative Examples 1 and 5 show that the entire film cannot meet the desired CTE values: even if the CTE values of the first polyimide layers may fall within the desirable range between 13 and 30 ppm/° C., the CTE values of the second polyimide layer are either undesirably low (i.e., less than 5 for Comparative Example 1) or undesirably high (i.e., more than 60 for Comparative Example 5). In other words, the multilayer films of these comparative examples have poor match with the copper foil.

Compared to Examples 1 and 3, the test results of Comparative Examples 2 and 6 show that the entire film also fails to meet the desired CTE values: even if the CTE values of the second polyimide layer may fall within the desirable range, the CTE values of the first polyimide layer are either undesirably low (i.e., less than 15 for Comparative Example 2) or undesirably high (i.e., more than 30 for Comparative Example 6). In other words, the multilayer films of these comparative examples have poor match with the copper foil.

Furthermore, the test results of Comparative Examples 3 and 7 show that the thickness ratio of the layers may have some importance. When the ratio h2/h1 is more than 1/6, the entire tri-layered film does not have a desired CTE value between 13 and 30 ppm/° C., even if the CTE values of the first and the second polyimide layers may fall within the desirable range.

Compared to Examples 1 and 3, the test results of Comparative Examples 4 and 8 show that the total thickness of the tri-layered film may also affect the CTE of the multilayered film. When the total thickness is more than 80 μm, the entire tri-layered film does not have a desirable CTE value between 13 and 30 ppm/° C., even if the CTE values of the first and the second polyimide layers may fall within the desirable range.

Moreover, the test results of Comparative Example 9 show that the tri-layered film has an excessively high $D_k$ value when the incorporated quantity of the fluorine-containing polymer particles is less than 10 wt %. The test results of Comparative Example 10 also show that no film is properly formed when the incorporated quantity of the fluorine-containing polymer particles is more than 45 wt %.

With respect to Comparative Example 11, the formed tri-layered film exhibits insufficient metal adhesion when no adhesion-promoting additive is contained in the second polyimide layer. This tri-layered film is unsuitable for metalized film applications.

Accordingly, the present application provides a multilayered polyimide film that has a desirably low dielectric constant Dk smaller than 3.2, desirably low dissipation factor Df smaller than 0.012, a CTE matching with that of a copper foil, and excellent metal adhesion characteristics. In particular, the multilayered polyimide film can include a first polyimide layer with a low dielectric constant $D_k$, and a second polyimide layer with good metal adhesion characteristics. These two polyimide layers can be designed so as to have CTE values in certain ranges (i.e., 15-30 ppm/° C. for the first polyimide layer and 5-60 ppm/° C. for the second polyimide layer), and the total thickness of the film can be set (i.e., less than 80 μm) so that the multilayered polyimide film can have the desired characteristics.

Realizations of the multilayered polyimide films and methods of manufacturing the same have been described in the context of particular embodiments. These embodiments are meant to be illustrative and not limiting. Many variations, modifications, additions, and improvements are possible. These and other variations, modifications, additions, and improvements may fall within the scope of the invention as defined in the claims that follow.

What is claimed is:
1. A multilayered polyimide film comprising:
a first polyimide layer incorporating fluorine-containing polymer particles, and having a first surface and a second surface; and
a second polyimide layer and a third polyimide layer respectively disposed on the first surface and the second surface, the second and the third polyimide layers respectively containing organic silicon oxygen compound particles;
wherein the multilayered polyimide film has a coefficient of thermal expansion (CTE) between about 13 and about 30 ppm/° C.

2. The multilayered polyimide film according to claim 1, wherein the first polyimide layer has a thickness h1, the second polyimide layer has a thickness h2, and the ratio h2/h1 is about 1/6 or less.

3. The multilayered polyimide film according to claim 1, wherein a total thickness of the multilayered polyimide film is about 80 µm or less.

4. The multilayered polyimide film according to claim 1, wherein the fluorine-containing polymer particles are about 10 to about 45 wt % of the first polyimide layer.

5. The multilayered polyimide film according to claim 1, wherein the fluorine-containing polymer is selected from a group consisting of polytetrafluoroethylene (PTFE), perfluoroalkoxy (PFA), fluorinated ethylene propylene (FEP), chlorotrifluoroethylene (CTFE), ethylene chlorotrifuloroethylene (ECTFE) and polyfluorinated vinylidene (PVDF).

6. The multilayered polyimide film according to claim 1, wherein the fluorine-containing polymer particles have an average particle diameter between about 1 and about 5 µm.

7. The multilayered polyimide film according to claim 1, wherein the organic silicon oxygen compound particles have an average particle diameter between about 1 and about 100 nm.

8. The multilayered polyimide film according to claim 1, wherein the second polyimide layer contains a polyimide polymer formed by a condensation reaction applied on diamine and dianhydride monomers, wherein:
the diamine monomers are 2,2'-dimethyl[1,1'-biphenyl]-4,4'-diamine (m-TB-HG) or 2,2'-Bis(trifluoromethyl) benzidine (TFMB); and
the dianhydride monomers are selected either from a group consisting of a group (C), or from at least one monomer species of the group (C) and at least one monomer species of a group (D) with the dianhydride monomers selected from the group (D) having a total number of moles equal to 0.45 or less,
the group (C) including pyromellitic dianhydride (PMDA) and 3,3',4,4'-biphenyltetracarboxylic dianhydride (BPDA), and
the group (D) including 2,2-bis[4-(3,4dicarboxyphenoxy) phenyl]propane dianhydride (BPADA), 2,2'-bis-(3,4-dicarboxyphenyl)hexafluoropropane dianhydride (6FDA), 4,4-oxydiphthalic anhydride (ODPA), benzophenonetetracarboxylic dianhydride (BTDA) and 3,3',4,4'-dicyclohexyltetracarboxylic acid dianhydride (HBPDA).

9. The multilayered polyimide film according to claim 1, wherein the second polyimide layer has a polyimide polymer formed by a condensation reaction applied on diamine and dianhydride monomers, the diamine monomers are phenylenediamine (p-PDA), and the dianhydride monomers are selected from a group consisting of BPDA, BPADA, 6FDA, ODPA, BTDA and HBPDA.

10. The multilayered polyimide film according to claim 1, wherein the second polyimide layer has a polyimide polymer formed by a condensation reaction applied on diamine and dianhydride monomers, wherein:
the diamine monomers are selected from a group consisting of a group (B): oxydianiline (ODA), 1,3-bis(4-aminophenoxy)benzene (TPER), 1,4-bis(4-aminophenoxy)benzene (TPEQ), 1,3'-bis(3-aminophenoxy) benzene (APBN), 3,5-diaminobenzotrifluoride (DABTF), and 2,2'-bis[4-(4-aminophenoxy)phenyl] propane (BAPP); and
the dianhydride monomers are selected from at least one monomer species of a group (C) and at least one monomer species of a group (D), wherein the group (C) includes PMDA and BPDA, and the group (D) includes BPADA, 6FDA, ODPA, HBPDA and BTDA;
wherein the diamine monomers selected from the group (B) have a total number of moles "b", the dianhydride monomers selected from the group (D) have a total number of moles "d", and the sum b+d is less than 0.9.

11. The multilayered polyimide film according to claim 1, wherein the second polyimide layer has a polyimide polymer formed by a condensation reaction applied on diamine and dianhydride monomers, wherein:
the diamine monomers are selected from at least one monomer species of a group (A) and at least one monomer species of a group (B), the group (A) including PDA, m-TB-HG, 6-amino-2-(4-aminophenyl)benzoxazole (6PBOA), 5-amino-2-(4-aminophenyl)benzoxazole (5PBOA) and TFMB, and the group (B) including ODA, TPER, TPEQ, APBN, DABTF and BAPP; and
the dianhydride monomers are selected from at least one monomer species of a group (C) and at least one monomer species of a group (D), the group (C) including PMDA and BPDA, and the group (D) including BPADA, 6FDA, ODPA, HBPDA and BTDA;
wherein the diamine monomers selected from the group (B) have a total number of moles "b", the dianhydride monomers selected from the group (D) have a total number of moles "d", and the sum b+d is less than 0.9.

12. The multilayered polyimide film according to claim 1, wherein a dielectric constant of the multilayered polyimide film is less than 3.2, and a dissipation factor of the multilayered polyimide film is less than 0.012.

13. The multilayered polyimide film according to claim 1, wherein the first polyimide layer has a CTE value between 15 and 30 ppm/° C., and the second polyimide layer has a CTE value between 5 and 60 ppm/° C.

* * * * *